United States Patent [19]

Moslehi

[11] Patent Number: 5,073,516
[45] Date of Patent: Dec. 17, 1991

[54] SELECTIVE EPITAXIAL GROWTH PROCESS FLOW FOR SEMICONDUCTOR TECHNOLOGIES

[75] Inventor: Mehrdad M. Moslehi, Dallas, Tex.
[73] Assignee: Texas Instruments Incorporated, Dallas, Tex.
[21] Appl. No.: 662,078
[22] Filed: Feb. 28, 1991
[51] Int. Cl.$^5$ .............................................. H01L 21/20
[52] U.S. Cl. ...................................... 437/89; 437/90; 437/228; 437/67; 437/941; 437/69; 148/DIG. 26; 148/DIG. 50; 148/DIG. 97
[58] Field of Search ................ 437/89, 228, 90, 239, 437/67, 941, 69; 148/DIG. 26, DIG. 97, DIG. 50

[56] References Cited

U.S. PATENT DOCUMENTS 4,758,531 7/1988 Beyer et al. ........................... 437/90

FOREIGN PATENT DOCUMENTS 0086838 4/1987 Japan ..................................... 437/89
0058921 3/1988 Japan ..................................... 437/89
0302838 2/1990 Japan .

OTHER PUBLICATIONS

"Silicon Selective Epitaxial Growth and Electrical Properties of Epi/Sidewall Interfaces" Ishitani et al., Japanese Jour. of Appl. Physics, Part 1. May, 1989, pp. 841–848.
"Silicon Selective Epitaxial Growth at 800° C. Using SiH$_4$/H$_2$ Assisted by H$_2$/Ar Plasma Sputter", Yew et al., Appl. Phys. Lett. 55(10), Sep., 1989, pp. 1014–1016.
"Low-Temperature Silicon Selective Deposition and Epitaxy on Silicon Using the Thermal . . . " Appl. Physics Lett. 54(11), Mar. 1989, Murota et al., pp. 1007–1009.
"Low-Temperature Selective Epitaxial Growth of Silicon at Atmospheric Pressure" Sedgwick et al. Appl. Phys. Lett 54(26), Jun., 1989, pp. 2689–2691.
SEG Materials Status 1988, "Third Annual Innovations in Epitaxial Technology for Advanced Device Structures", Seminar, John O. Borland.
"Advanced DRAM Structures incorporating Selective Epitaxy", Third Annual Innovations in Epitaxial Technology for Advanced Device Structures Seminar, Gary Bronner.
"Selective Epitaxial Growth for CMOS Isolation", Stivers et al., Components Research Intel Corporation, Santa Clara, CA.

Primary Examiner—Brian E. Hearn
Assistant Examiner—Trung Dang
Attorney, Agent, or Firm—Melvin Sharp; James T. Comfort; Stanton C. Braden

[57] ABSTRACT

This is a method of fabricating a high-performance semiconductor device. The method comprises: forming a first insulating structure, preferably a layer of silicon nitride (e.g. region 24 in FIG. 2) on a layer of thermally grown oxide (e.g. region 22), on a substrate (e.g. region 20), preferably silicon; patterning and anisotropically etching the first insulating structure to expose a portion of the substrate and sidewalls of the first insulating structure; forming a second insulating structure, preferably a layer of oxide (e.g. region 28 in FIG. 3) on a layer of nitride (the bottom second insulating layer is preferably an etch-stop layer with respect to the removal of the top second insulating layer) (e.g. region 26 in FIG. 3), on the patterned first insulating structure, along the sidewalls of the first insulating structure, and on the exposed semiconductor substrate; anisotropically removing portions of the second insulating structure leaving a sidewall region of the second insulating structure (e.g. regions 30 and 32 in FIG. 4) along the sidewall of the first insulating structure and a region of the second insulating structure on a portion of the exposed substrate, and exposing a portion of the exposed substrate; forming a region of semiconducting material (e.g. regions 36 and 34, respectively, in FIG. 5), preferably a selectively grown semiconducting layer (preferably in-situ doped epitaxial silicon), encompassed by the second insulating structure and the exposed region of the substrate; sequentially and selectively etching the second insulating sidewall region to substantially expose the sidewalls of the selectively grown semiconducting region and top of the semiconducting region; and forming a third insulating layer (e.g. region 40 in FIG. 8 and region b 46 in FIG. 11), preferably a thermally grown oxide layer or a low-temperature plasma oxidation layer, on the exposed semiconducting region and on the exposed sidewalls of the semiconducting region.

31 Claims, 2 Drawing Sheets

SELECTIVE EPITAXIAL GROWTH PROCESS FLOW FOR SEMICONDUCTOR TECHNOLOGIES

FIELD OF THE INVENTION

The invention pertains to integrated circuit fabrication, and more particularly to semiconductor devices with selectively grown semiconductor regions encompassed by insulator regions.

BACKGROUND OF THE INVENTION

Using present semiconductor fabrication technology, problems arise with circuits comprising of selectively grown semiconducting material, such as selectively grown epitaxial (SEG) silicon, in regions encompassed by an insulating material. Because the SEG material is selectively grown on the seed semiconductor material beneath it, such as a silicon substrate, the two materials form a very good crystalline structure match with a defect free interface. This is not true for the interface between the selectively grown semiconductor material and the encompassing insulating material. The selectively grown semiconducting material usually has a non ideal, defective, interface with its neighboring oxide or insulator sidewalls. This semiconductor/insulator sidewall interface lacks strong chemical bonds between the two materials, resulting in a high concentration of semiconductor dangling bonds and electrically active surface states or traps at the interface.

The problem becomes particularly troublesome in the case in which the semiconducting material is comprised of two, oppositely doped, semiconducting materials, thus, forming an active device junction. The device leakage that occurs due to the surface states or dangling bonds between the sidewalls of the selectively grown semiconducting material and the field insulating material can seriously degrade the overall device performance. This interface induced leakage current will result in a substantial increase in reverse junction leakage current, and will also degrade the forward current versus voltage characteristics of the device.

One technique used in an attempt to reduce this sidewall leakage problem is a post SEG anneal in an oxygen ambient. However, oxygen annealing cannot significantly reduce the leakage problem (and in some instances it may increase the leakage problem) because of the possible stresses introduced by the thermal oxidation process.

As a result of the poor semiconductor/insulator sidewall interface and the associated sidewall leakage problem, the device p-n junctions (or Schottky contacts) and depletion layers are usually kept away from the SEG sidewalls, particularly in minority carrier devices, such as bipolar transistors. This method is not acceptable for some applications due to the larger device layout area required because of the addition of the buffer spacer regions between the active device junction region and the selectively grown semiconductor sidewalls.

SUMMARY OF THE INVENTION

This is a method of fabricating defect free selectively grown semiconductor regions for high performance semiconductor devices. The method comprises: forming a first insulating structure, preferably a chemical-vapor deposited (CVD) layer of nitride or oxide (preferably silicon nitride) on a layer of chemical vapor deposited oxide or thermally grown oxide, on a substrate, preferably single crystal silicon; patterning and anisotropically etching the first insulating structure to expose a portion of the substrate and sidewalls of the first insulating structure; forming a second insulating structure, preferably a CVD layer of nitride or oxide (preferably oxide) on a CVD layer of oxide or nitride (the bottom second insulating layer, preferably silicon nitride, is preferably an etch stop layer with respect to the removal of the top second insulating layer), on the patterned first insulating structure, along the sidewalls of the first insulating structure, and on the exposed semiconductor substrate; anisotropically removing portions of the second insulating structure leaving a sidewall region of the second insulating structure along the sidewall of the first insulating structure and a region of the second insulating structure on a portion of the exposed semiconductor substrate, and exposing a portion of the exposed substrate; forming a region of semiconducting material, preferably a selectively grown semiconducting layer (preferably in situ doped epitaxial silicon), encompassed by the second insulating structure and the exposed region of the substrate; subsequently and selectively etching the second insulating sidewall region to substantially expose the sidewalls of the selectively grown semiconducting region and top of the semiconducting region without removing the field insulating region; and forming a third insulating layer, preferably a thermally grown oxide layer or a low temperature plasma oxidation layer, on the exposed semiconducting region and on the exposed sidewalls of the selectively grown semiconducting region.

One embodiment of the present invention comprises a method wherein the top second insulating sidewall region and the bottom second insulating sidewall region are selectively and sequentially removed (with respect to the selectively grown semiconducting region, the substrate, and the patterned first insulating structure) to expose the sidewalls of the patterned first insulating structure, a portion of the exposed substrate between the sidewall of the patterned first insulating structure and sidewalls of the selectively grown semiconducting region, and the sidewalls of the selectively grown semiconducting region. The third insulating layer is formed on the exposed portion of the exposed substrate, on the sidewalls of the selectively grown semiconducting region, and on the selectively grown semiconducting region. An insulating material, preferably an oxide, a nitride, a nonconductive polysilicon, or any combination thereof, is then deposited, preferably conformally, to fill the trench region encompassed by the sidewalls of the patterned first insulating structure and the third insulating layer. Once this region is filled, the excess deposited material on the top surface is substantially removed, and then the third insulating layer, on the top surface of the selectively grown semiconducting region, is removed.

A second preferred embodiment of the present invention is essentially similar to the first embodiment with the exception that the bottom second insulating sidewall region is not removed prior to the formation of the third insulating layer and filling of the trenches (the bottom second insulating sidewall region remains as an integral part of the overall device structure).

Another embodiment of the present invention comprises a method wherein the top second insulating sidewall region is selectively removed (with respect to the bottom second insulating sidewall region, the patterned first insulating region, and the semiconducting region)

to substantially expose the sidewalls of the selectively grown semiconducting region and the bottom second insulating sidewall region. The third insulating material is formed on the exposed regions of the sidewalls of the selectively grown semiconducting region and atop the exposed semiconducting region. The bottom second insulating sidewall region is then selectively removed to expose the sidewall of the patterned first insulating layer, a portion of the exposed substrate between the sidewall of the patterned first insulating structure and the sidewall of the semiconducting region, and a portion of the sidewall of the semiconducting region between the exposed substrate and the third insulating layer. A conducting or an insulating plug, preferably an in-situ doped or undoped selectively grown polycrystalline, amorphous, or single crystal silicon, is formed in the region encompassed by the exposed walls of the patterned first insulating structure, the exposed portion of the substrate, and the exposed portion of the sidewall of the selectively grown semiconducting region.

BRIEF DESCRIPTION OF THE DRAWINGS

FIGS. 1 through 6 and FIGS. 11 through 13 are cross sectional side views illustrating the processing steps of the second preferred embodiment of the present invention. FIGS. 1 through 6, FIG. 11, and FIG. 14 are cross sectional side views illustrating the processing steps of the third preferred embodiment of the present invention.

DETAILED DESCRIPTION OF PREFERRED EMBODIMENTS

A first preferred embodiment of the present invention is illustrated in FIGS. 1 through 10. A second preferred embodiment of the present invention is illustrated in FIGS. 1 through 6 and completed in FIGS. 11 through 13. A third preferred embodiment of the present invention is illustrated in FIGS. 1 through 6 and completed in FIGS. 11 and 14. Like numerals are used throughout the drawings to represent like and corresponding parts. FIGS. 1 through 14 are cross sectional side views of the present invention throughout various device fabrication process steps.

Figure 1:
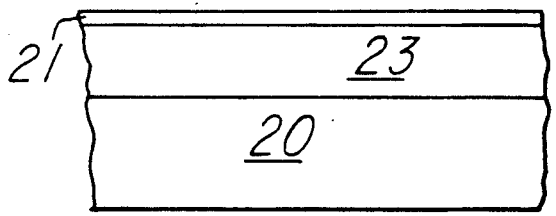
FIGS. 1 through 10 are cross sectional side views illustrating the processing steps of the first preferred embodiment of the present invention.

FIG. 1 illustrates a cross-sectional side view of the semiconductor, usually silicon, substrate 20 after a series of process steps. A layer of field insulating material 23, preferably silicon oxide, is either grown by thermal oxidation or deposited by CVD (chemical-vapor deposition) on the substrate 20. This insulating layer may also be formed by a combination of thermal oxidation and a subsequent CVD process step. A layer of a second insulating material 21, preferably silicon nitride, is deposited on the first insulating material. The preferable thickness of the first and second insulating layers is approximately 10000 Å and 1000 Å, respectively.

Figure 2:
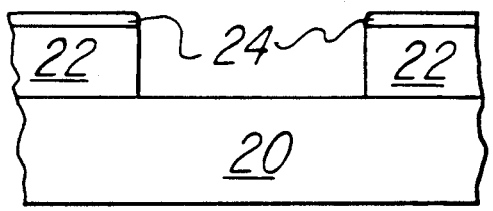

FIG. 2 illustrates a cross sectional side view of the preferred embodiment after further process steps. Once the first 23 and second 21 insulating layers are deposited, they are patterned and anisotropically etched, forming a patterned first insulating layer 22 and a patterned second insulating layer 24, thus exposing a portion of the substrate 20. These etched regions of the patterned first 22 and second 24 insulating layers facilitate in selectively growing epitaxial silicon on the substrate seed regions in order to form device regions.

Figure 3:
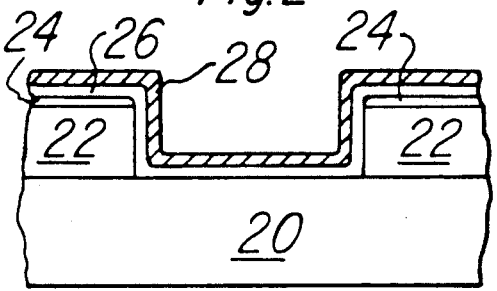

FIG. 3 illustrates a cross sectional side view of the preferred embodiment after further process steps. Once the first and second insulating layers are patterned, a third insulating layer 26 is deposited, preferably by CVD, on the patterned second insulating layer 24, the exposed portion of the substrate 20, and along the exposed sides of the first 22 and second 24 patterned insulating layers (shown in FIG. 2). The third insulating layer 26 is preferably comprised of the same material as the second insulating layer 24, namely silicon nitride, and the preferable thickness of the third insulating layer 26 is approximately 1000 Å. A fourth insulating layer 28, preferably silicon oxide, is deposited, preferably by CVD, on the third insulating layer 26.

Figure 4:
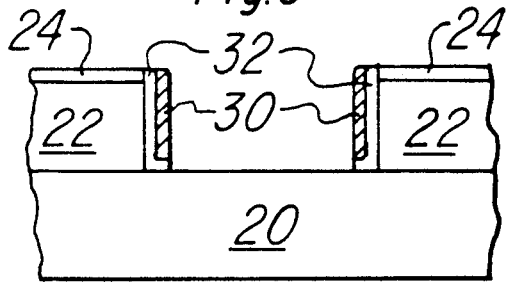

FIG. 4 is a cross-sectional side view of the preferred embodiment after further process steps. An anisotropic etch, preferably a reactive-ion etch process, is utilized in order to selectively remove the third and fourth insulating layers on the patterned second insulating layer 24 and portions of the exposed substrate. Because the third insulating layer acts as an etch stop for the subsequent etching of the fourth insulating layer, and the etchant required to remove the third insulating layer etches the material of the patterned first insulating layer much more slowly, the first insulating layer remains substantially unaltered during these, as well as subsequent, etch processes. For the most part, the only portion 32 of the third insulating layer 26 (shown in FIG. 3) that remains is the portion which was deposited along the exposed sidewalls of the patterned first 22 and second 24 insulating layers in the exposed region 21 (shown in FIG. 2). Likewise, the fourth insulating region 30 remains only on the remaining third insulating region 32. A subsequent short thermal oxidation and wet oxide etch can be performed in order to remove any plasma induced damage on the exposed semiconductor regions.

Figure 5:
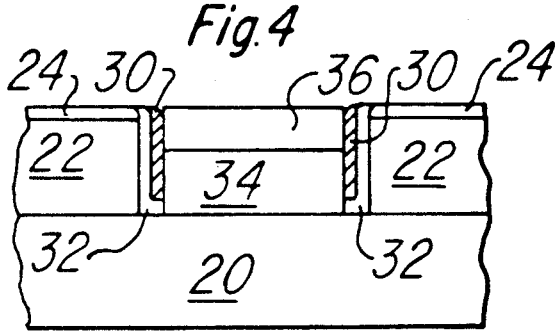

FIG. 5 is a cross sectional side view of the preferred embodiment after further process steps. This figure illustrates a selective epitaxial growth (SEG) process. This example illustrates a formation of n+-p junctions in the SEG islands. A first semiconducting layer 34, preferably in-situ doped p type silicon, is selectively grown, preferably epitaxially, on the exposed seed region of the substrate. A second semiconducting layer 36, preferably in situ doped n+-type silicon, is then selectively grown, preferably epitaxially, on the selectively grown first semiconducting material 34. The first 34 and second 36 semiconductor layers are contained and surrounded by the third 32 and fourth 30 insulating sidewall regions.

Figure 6:
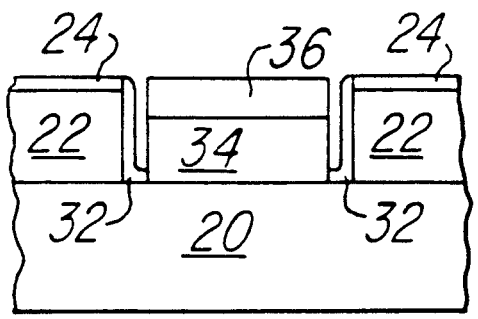

FIG. 6 is a cross sectional side view of the preferred embodiment after further processing. The fourth insulating region 30 (shown in FIG. 4 and FIG. 5) is removed, preferably by utilizing an isotropic wet etch or plasma etch with a high oxide etch selectivity with respect to silicon nitride and silicon. One method of removing this region 30 is to utilize a wet HF based etchant. Note that the second insulating layer 24 (preferably silicon nitride) and the remaining third insulating layer 32 (preferably silicon nitride) will protect the first insulating region 22 (preferably silicon oxide used as a field insulating layer).

Figure 7:
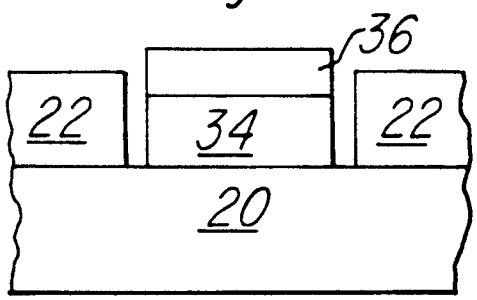

FIG. 7 is a cross-sectional side view of the first preferred embodiment after further process steps. Once the fourth insulating region 30 is selectively removed, the third insulating region 32 and the patterned second insulating layer 24 are removed, preferably by a selective isotropic nitride etch. For example, the etch could be a hot phosphoric acid etch or a suitable isotropic plasma etch. Due to the sequential and selective removal of the fourth 30 and third 32 insulating regions, a portion of the substrate (between the selectively grown semiconducting region 34 and the first patterned insulating layer) is exposed along with the sidewalls of the selectively grown semiconducting regions (34 and 36) and the top of the patterned first insulating layer 22, also known as the field insulating region).

Figure 8:
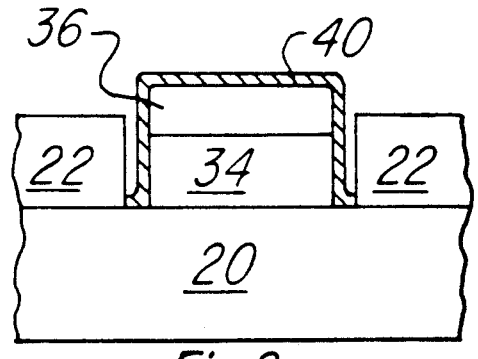

FIG. 8 is a cross-sectional side view of the first preferred embodiment after further device processing. A layer of fifth insulating material 40 is grown, preferably by thermal oxidation, on the exposed substrate, on the sidewalls of the first 34 and second 36 semiconducting material layers, and on the exposed selectively grown semiconducting material 36. The thickness of the fifth insulating layer 40 is preferably on the order of 100 Å to a few hundred angstroms, and it is grown so as not to appreciably redistribute any of the dopants.

Figure 9:
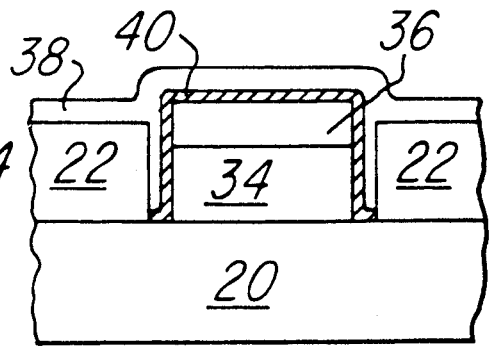

FIG. 9 is a cross sectional side view of the first preferred embodiment after further device processing. A layer of sixth insulating material 38 is deposited, preferably by CVD, on the device, filling the trenches between the patterned first insulating layer 22 and the fifth insulating layer 40. Preferably, the sixth insulating layer 38 is approximately 1000 Å thick and is comprised of oxide, nitride, or undoped polysilicon.

Figure 10:
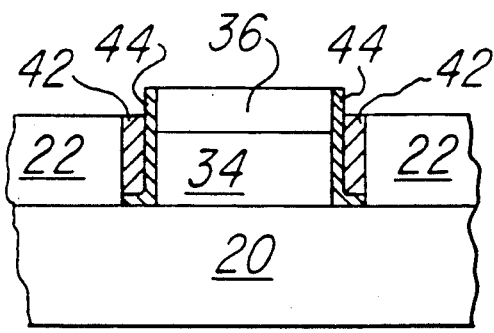

FIG. 10 is a cross sectional side view of the first preferred embodiment after further device processing. The sixth insulating layer 38 is anisotropically removed, preferably by a reactive-ion etch, in the regions above the patterned first insulating layer 22 and the second semiconductor region 36. Leaving the insulating region 42 between the patterned first insulating layer 22 and the fifth insulating layer 40 filled with the sixth insulating material. In the process of removing the sixth insulating layer, the fifth insulating layer, on the selectively grown second semiconductor region 36, is also removed, thus, leaving the fifth insulating material in a region 44 between the sixth insulating region 42 and the selectively grown first and second semiconducting regions (34 and 36, respectively) and the sixth insulating region 42 and the substrate 20.

Figure 11:
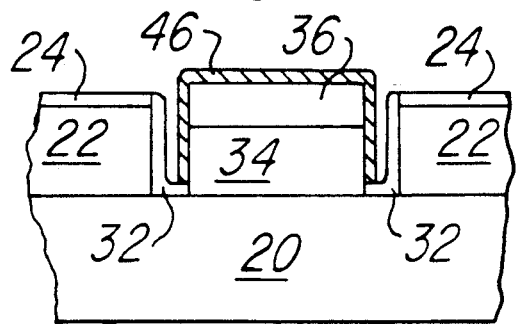

FIG. 11 is a cross-sectional side view of the second preferred embodiment after further processing of the structure illustrated in FIG. 6. Once the fourth insulating region 30 is removed (see FIG. 6), a seventh insulating layer 46, preferably an oxide, is formed, preferably by thermal oxidation or by low-temperature microwave plasma oxidation, on the selectively grown second semiconducting layer 36, along the sidewalls of the selectively grown second semiconducting layer 36, and along the sidewalls of the first semiconducting layer 34 to the third insulating region 32.

Figure 12:
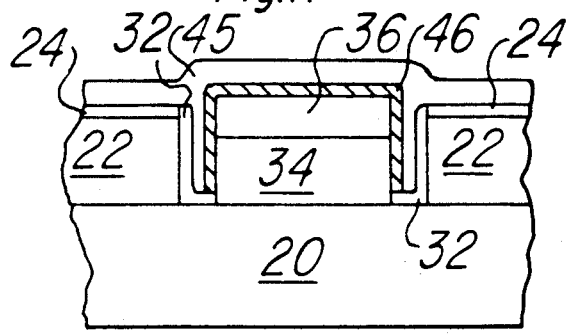

FIG. 12 is a cross-sectional side view of the second preferred embodiment after further device processing. Once the seventh insulating layer 46 is formed, an eighth insulating layer 45, preferably an oxide or a nitride (preferably silicon oxide) is deposited, preferably by CVD, on the patterned second insulating layer 24, on the seventh insulating layer 46 (over the selectively grown second semiconducting region 36, and in the trench region encompassed by the seventh insulating layer 46 and the third insulating region 32 (thus filling the trench).

Figure 13:
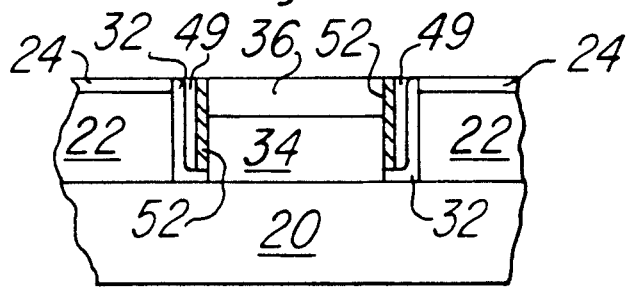

FIG. 13 is a cross-sectional side view of the second preferred embodiment after further device processing. The eighth insulating layer 45 (see FIG. 12) is removed, preferably by a plasma etch controlled by known plasm etch endpoint detection techniques (e.g. optical endpoint detection), in the regions above the patterned second insulating layer 24 and the selectively grown second semiconducting region 36. Thus leaving a region of the eighth insulating layer 49 encompassed by the third insulating region 32 and the seventh insulating layer 46 (see FIG. 12). During this same process, the region of the seventh insulating layer above the selectively grown second semiconducting region 36 is removed, leaving a region 52 encompassed by the sidewalls of the selectively grown first 34 and second 36 semiconducting regions, the third insulating region 32, and the seventh insulating region 49.

Figure 14:
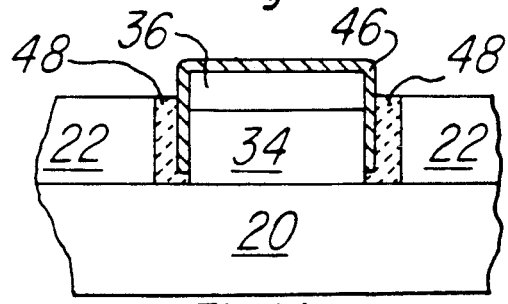

FIG. 14 is a cross sectional side view of the third preferred embodiment after further device processing on the structure described in FIG. 11. Once the seventh insulating layer is formed, the patterned second insulating layer 24 and the third insulating region 32 are selectively removed, thus exposing the top and the sidewalls of the patterned first insulating layer 22, a portion of the substrate between the patterned first insulating layer and the first semiconducting layer 34, and a portion of the first semiconducting layer between the substrate 20 and the seventh insulating layer 46. These two insulating materials are preferably selectively removed with respect to the patterned first insulating layer 22 and the sixth insulating layer 46. A semiconductor plug 48, preferably a doped silicon, is formed, preferably by selective silicon growth, in the trench encompassed by the sidewalls of the patterned first insulator, the sixth insulating layer 46, the exposed portion of the first semiconducting layer between the substrate 20 and the sixth insulating layer 46, and an exposed portion of the substrate between the first semiconducting layer 34 and the patterned first insulating layer 22. The semiconducting plug 48 makes an electrical connection with the substrate and the first semiconductor layer.

The semiconducting plug 48 can also be made undoped, thereby acting as an insulator. After the semiconducting plug is selectively grown, the region of the seventh insulating layer above the selectively grown second semiconducting region 36 is removed.

Standard process steps follow for each of the three preferred embodiment to complete the entire device fabrication process flow.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What is claimed is:

1. A method of fabricating a semiconductor device, wherein said method comprises:
   a. forming a first insulating structure on a substrate;
   b. patterning and etching said first insulating layer to expose a portion of said substrate and sidewalls of said first insulating structure;
   c. forming a second insulating structure comprising a top insulating layer and a bottom insulating layer on said patterned first insulating structure, along said sidewalls of said first insulating structure, and on said exposed substrate;
   d. anisotropically removing portions of said second insulating structure leaving a sidewall region of said second insulating material along said sidewall of said first insulating structure and a region of said second insulating structure on a portion of said exposed substrate, and exposing a portion of said exposed substrate;

e. selectively forming a region of semiconducting material encompassed by said second insulating structure and said exposed region of said substrate;

f. etching said second insulating sidewall region to substantially expose said sidewalls of said semiconducting region and top of said semiconducting region; and g. forming a third insulating layer on said exposed semiconducting region and on said exposed sidewalls of said semiconducting region.

2. The method of claim 1, wherein said top second insulating sidewall region and said bottom second insulating sidewall region are selectively and sequentially removed (with respect to said semiconducting region, said substrate, and said patterned first insulating structure) to expose said sidewall of said patterned first insulating structure, a portion of said exposed substrate between said sidewall of said patterned first insulating structure and sidewalls of said semiconducting region, and said sidewalls of said semiconducting region.

3. The method of claim 2, wherein said third insulating layer is formed on said exposed portion of said exposed substrate, on said sidewalls of said semiconducting region, and on said semiconducting region.

4. The method of claim 3, wherein a non conductive material is utilized to fill the region encompassed by said sidewalls of said patterned first insulating layer and said third insulating layer.

5. The method of claim 4, wherein exposed said third insulating layer on said semiconducting region is removed.

6. The method of claim 4, wherein said third insulating layer on said semiconducting region and abutting said non conducting material, and excess said non conductive material are removed in the same etch process step.

7. The method of claim 1, wherein said top second insulating sidewall region is selectively removed (with respect to said bottom second insulating sidewall region, said patterned first insulating region, and semiconducting region) to substantially expose said sidewalls of said semiconducting region and said bottom second insulating sidewall region.

8. The method of claim 7, wherein said third insulating material is formed on said exposed regions of said sidewalls of said semiconducting region and on said semiconducting region.

9. The method of claim 8, wherein said bottom second insulating sidewall region is removed to expose said sidewall of said patterned first insulating layer, a portion of said exposed substrate between said sidewall of said patterned first insulating layer and said sidewall of said semiconducting region, and a portion of said sidewall of said semiconducting region between said exposed substrate and said third insulating layer.

10. The method of claim 9, wherein a plug is formed in the region encompassed by said exposed said walls of said patterned first insulating layer, said exposed portion of said exposed substrate, said exposed portion of said sidewall of said semiconducting region, and a portion of said third insulating material.

11. The method of claim 1, wherein said semiconducting region is comprised of a top semiconducting region and a bottom semiconducting region.

12. The method of claim 1, wherein said bottom second insulating layer is an etch stop layer with respect to the removal of said top second insulating layer.

13. The method of claim 1, wherein said first insulating structure is comprised of a top insulating layer and a bottom insulating layer.

14. The method of claim 13, wherein said bottom second insulating layer is comprised of the same material as said top first insulating layer.

15. The method of claim 1, wherein said third insulating layer is selected from the group consisting of: oxides, nitrides, or any combination thereof.

16. The method of claim 1, where said forming of said third insulating layer is selected from the group consisting of: thermal oxidation, thermal nitridation, oxynitridation, low-temperature plasma oxidation, or any combination thereof.

17. The method of claim 13, wherein said bottom first insulating layer is selected from the group consisting of nitrides, oxides, or any combination thereof.

18. The method of claim 1, wherein said providing of said bottom first insulating material is selected from the group consisting of thermal oxidation, chemical vapor deposition, physical-vapor deposition, or any combination thereof.

19. The method of claim 12, wherein said top first insulating layer is selected from the group consisting of nitrides, oxides, or any combination thereof.

20. The method of claim 1, wherein said bottom second insulating material is selected from the group consisting of nitrides, oxides, or any combination thereof.

21. The method of claim 1, wherein said top second insulating material is selected from the group consisting of nitrides, oxides, or any combination thereof.

22. The method of claim 3, wherein said non-conducting material is selected from the group consisting of nitrides, oxides, undoped polysilicon, undoped amorphous silicon, or any combination thereof.

23. The method of claim 1, wherein said semiconducting region is in situ doped silicon.

24. The method of claim 1, wherein said forming of said semiconducting region is selective epitaxial growth.

25. The method of claim 1, wherein said semiconducting region comprises doped active device junctions.

26. The method of claim 10, wherein said plug is selected form the group consisting of: in-situ doped polycrystalline silicon, undoped silicon, tungsten, amorphous silicon, epitaxial silicon, or any combination thereof.

27. The method of claim 10, wherein said formation of said plug is selectively growing said plug.

28. The method of claim 1, wherein said substrate is single crystal silicon.

29. The method of claim 8, wherein a layer of fourth insulating material is provided in the region encompassed by said bottom second insulating layer and said third insulating layer.

30. The method of claim 29, wherein said fourth insulating material is selected from the group consisting of undoped silicon, nitrides, oxides, or any combination thereof.

31. A method of fabricating a semiconductor device, said method comprising:

a. providing a first oxide layer on a semiconductor substrate;

b. depositing a first nitride layer;

c. patterning and etching said first oxide layer and said first nitride layer to provide a region in which the substrate and a wall of said first oxide and first nitride layers are exposed;
d. depositing a second nitride layer over said patterned first nitride layer, over said exposed substrate, and on said wall of said first oxide and first nitride layers;
e. depositing a second oxide layer on said second nitride layer;
f. anisotropically etching said second oxide and second nitride layers to substantially remove all of said layers over said patterned first nitride layer and said exposed substrate leaving a region of substantially unetched said second oxide and second nitride layers along said wall of said first oxide and first nitride layers;
g. providing a selectively grown silicon region on said exposed substrate;
h. selectively etching said second oxide layer to expose sidewalls of said selectively grown silicon region and sidewalls of said second nitride layer;
i. selectively etching said second nitride layer and said first nitride layer to expose top and sidewalls of said patterned first oxide layer, a region of said exposed substrate between said selectively grown silicon region and said sidewall of said patterned first oxide layer, and sidewalls of said selectively grown silicon region;
j. providing a third oxide layer on said selectively grown silicon region, on said exposed region of said exposed substrate, and on said sidewalls of said selectively grown silicon region; and
k. providing an undoped polycrystalline silicon to substantially fill the region between said sidewall of said patterned first oxide layer and said third oxide layer.

* * * * *